(12) United States Patent
Hwang et al.

(10) Patent No.: US 12,495,526 B2
(45) Date of Patent: Dec. 9, 2025

(54) THERMAL RADIATION HEAT DISSIPATION DEVICE FOR ELECTRONIC COMPONENT AND PREPARATION METHOD THEREOF

(71) Applicant: NATIONAL TSING HUA UNIVERSITY, Hsinchu (TW)

(72) Inventors: Ching-Wen Hwang, Hsinchu (TW); Sih-Wei Chang, Hsinchu (TW); Yen-Jen Chen, Hsinchu (TW); De-hui Wan, Hsinchu (TW); Hsuen-Li Chen, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 762 days.

(21) Appl. No.: 17/747,904

(22) Filed: May 18, 2022

(65) Prior Publication Data
US 2023/0139367 A1    May 4, 2023

(30) Foreign Application Priority Data

| Oct. 29, 2021 | (TW) | 110140179 |
| Oct. 29, 2021 | (TW) | 110140180 |
| Feb. 24, 2022 | (TW) | 111106665 |

(51) Int. Cl.
| G06F 1/16 | (2006.01) |
| B29C 67/04 | (2017.01) |
| D01D 5/00 | (2006.01) |
| D04H 1/728 | (2012.01) |
| F28F 21/08 | (2006.01) |
| H05K 5/00 | (2025.01) |
| H05K 7/00 | (2006.01) |
| H05K 7/20 | (2006.01) |

(52) U.S. Cl.
CPC ........ H05K 7/20427 (2013.01); B29C 67/04 (2013.01); D01D 5/003 (2013.01); D04H 1/728 (2013.01); F28F 21/089 (2013.01); H05K 7/20336 (2013.01)

(58) Field of Classification Search
CPC ........... H05K 7/20427; H05K 7/20336; B29C 67/04; D01D 5/003; D04H 1/728; F28F 21/089
See application file for complete search history.

(56) References Cited

U.S. PATENT DOCUMENTS

| 9,282,656 B2 * | 3/2016 | Degner ................ F28D 15/02 |
| 9,835,382 B2 * | 12/2017 | Wang .................... F28F 13/08 |
| 11,044,829 B1 * | 6/2021 | Wu .................... H05K 7/20418 |
| 11,309,473 B2 * | 4/2022 | Carr .................... H10H 20/8584 |
| 2011/0005919 A1 * | 1/2011 | Madocks ............ H01J 37/3435 204/192.12 |
| 2017/0221596 A1 * | 8/2017 | Caldwell .................. G21K 5/00 |
| 2018/0045861 A1 * | 2/2018 | Caldwell ................ G01J 3/108 |
| 2018/0372424 A1 * | 12/2018 | Hurbi ................... F28D 20/025 |

* cited by examiner

*Primary Examiner* — Anthony M Haughton
(74) *Attorney, Agent, or Firm* — LANWAY IPR SERVICES; Chun-Ming Shih

(57) ABSTRACT

A thermal radiation heat dissipation device for an electronic component includes a heat dissipation substrate including a heat dissipation surface having a heat dissipation surface emissivity; and an emissivity modulation layer disposed on the heat dissipation surface including an emissivity modulation layer surface having an emissivity modulation layer surface emissivity. The emissivity modulation layer surface emissivity is greater the heat dissipation surface emissivity.

10 Claims, 13 Drawing Sheets

|  | $P_{rad}$ at 300K (W/m²) | $P_{rad}$ at 330K (W/m²) | $P_{rad}$ at 373K (W/m²) |
|---|---|---|---|
| h-BN | 338.4717 | 512.0148 | 860.1406 |
| SiO$_2$ | 323.7939 | 492.033 | 830.5877 |
| hBN+SiO$_2$ Porosity=0.3 vol% | 358.7212 | 544.4778 | 917.9307 |

FIG. 8

|  | $P_{rad}$ at 300K (W/m²) | $P_{rad}$ at 330K (W/m²) | $P_{rad}$ at 373K (W/m²) |
|---|---|---|---|
| $Si_3N_4$ | 297.2105 | 450.8717 | 757.9984 |
| $CaSO_4$ | 335.6018 | 507.0551 | 852.216 |
| $Si_3N_4$ + $CaSO_4$ Porosity=0.3 vol% | 351.6772 | 534.4307 | 902.3649 |

FIG. 10

THERMAL RADIATION HEAT DISSIPATION DEVICE FOR ELECTRONIC COMPONENT AND PREPARATION METHOD THEREOF

BACKGROUND OF THE INVENTION

1. Technical Field

The technical field relates to heat dissipation, and more particularly relates to a thermal radiation heat dissipation device for electronic component and preparation method thereof.

2. Description of Related Art

A great amount of heat is generated by electronic components of a computer, for example, while the computer runs, especially during power-intensive operations such as charging, updating, gaming, etc., it is normal for the computer to heat up due to heat accumulation on the chipsets. As a result, the computer's performance decreases or even the computer shuts down abnormally.

Traditional heat dissipation methods include using a metal heat sink and thermal conduction through contact surfaces of two bodies of different temperatures. Additionally, an internal fan or cooling pump is used to increase thermal convection for dissipating heat away from the bodies. Requirements of a heat sink are stringent as miniaturization of the electronic components and greatly increase density thereof. Thus, the conventional heat dissipation devices (e.g., heat sinks) do not satisfy demand for increased heat dissipation performance. However, the thermal convection's performance of the heat sink may be greatly decreased due to poor ventilation such as in an almost no wind environment, small internal space of a mobile phone, etc.

Typical heat sinks are made of metal (e.g., copper or aluminum). While the metal has high thermal conductivity, its thermal radiation is poor. The typical heat sinks are not capable of cooling an electronic component by means of thermal radiation only. Thus, heat still builds up inside the heat sink to compromise the desired heat dissipation purpose. While the fan and the cooling pump facilitate the removal of heat from the surface of the heat sink, additional power is required because they are active heat dissipation devices. Further, noise is inevitably generated in operation.

Thus, the need for improvement still exists.

SUMMARY OF THE INVENTION

It is therefore one object of the invention to provide a thermal radiation heat dissipation device, comprising a heat dissipation substrate including a heat dissipation surface having a heat dissipation surface emissivity; and an emissivity modulation layer disposed on the heat dissipation surface including an emissivity modulation layer surface having an emissivity modulation layer surface emissivity wherein the emissivity modulation layer surface emissivity is greater the heat dissipation surface emissivity.

In one of the exemplary embodiments, the heat dissipation substrate is formed of metal.

In one of the exemplary embodiments, the emissivity modulation layer includes a polar dielectric material assembly including a plurality of optical phonons which are capable of interacting with thermal radiation to increase strength of the thermal radiation.

In one of the exemplary embodiments, the polar dielectric material assembly includes a plurality of polar dielectric material units having an optical phonon configured to interact with thermal radiation.

In one of the exemplary embodiments, the emissivity modulation layer is polymer.

In one of the exemplary embodiments, the polymer is natural.

In one of the exemplary embodiments, the natural polymer is selected from the group consisting of silk fibroin, sericin, elastin, collagen, keratin, cellulose, hemicellulose, and chitosan.

In one of the exemplary embodiments, the polymer is composite.

In one of the exemplary embodiments, the composite polymer is selected from the group consisting of polyacrylic, polystyrene, polymethyl methacrylate, polyvinyl chloride, nylon, polycarbonate, polyurethane, teflon, polyethylene terephthalate, polyvinylidene fluoride, polyetherimide, polydimethylsiloxane, polyacrylamide, polyvinyl alcohol, polyethylene oxide, and polyvinylpyrrolidone.

In one of the exemplary embodiments, the emissivity modulation layer includes a polar dielectric material assembly including a plurality of first optical phonons and a plurality of second optical phonons; wherein the first optical phonons have a first resonant frequency and the second optical phonons having a second resonant frequency different from the first resonant frequency; wherein the first optical phonon is configured to interact with the first thermal radiation and the second optical phonon is configured to interact with the second thermal radiation, respectively; wherein the polar dielectric material assembly is configured to interact with a first thermal radiation and a second thermal radiation respectively; and wherein the first optical phonon is configured to increase strength of the first thermal radiation and the second optical phonon is configured to increase strength of the second thermal radiation respectively.

In one of the exemplary embodiments, the emissivity modulation layer includes a plurality of first and second polar dielectric material assemblies; wherein the first polar dielectric material assembly includes a plurality of first optical phonons and the second polar dielectric material assembly includes a plurality of second optical phonons respectively; wherein the first optical phonons have a first resonant frequency and the second optical phonons having a second resonant frequency different from the first resonant frequency; wherein the first polar dielectric material assembly is configured to interact with a first thermal radiation and the second polar dielectric material assembly is configured to interact with a second thermal radiation respectively; wherein the first optical phonon is configured to interact with the first thermal radiation and the second optical phonon is configured to interact with the second thermal radiation respectively; and wherein the first optical phonon is configured to increase strength of the first thermal radiation and the second optical phonon is configured to increase strength of the second thermal radiation respectively.

In one of the exemplary embodiments, the emissivity modulation layer includes a polar dielectric material assembly and a polymer assembly; wherein the polar dielectric material assembly has first resonant frequency and the polymer assembly has a second resonant frequency different from the first resonant frequency; wherein the polar dielectric material assembly is configured to interact with a first thermal radiation and the polymer assembly is configured to interact with a second thermal radiation respectively; and wherein the polar dielectric material assembly is configured to increase strength of the first thermal radiation and the polymer assembly is configured to increase strength of the second thermal radiation respectively.

In one of the exemplary embodiments, a method of preparing the thermal radiation heat dissipation device comprises the steps of providing a heat dissipation substrate; providing a material for modulating emissivity; and disposing the material for modulating emissivity on the heat dissipation substrate to produce an emissivity modulation layer.

In one of the exemplary embodiments, the method of preparing the thermal radiation heat dissipation device comprises the steps of providing both a solution having a precursor of fibrous material and a polymer for electrospinning; uniformly mixing the solutions to form a composite solution; subjecting the composite solution to an electrospinning machine for forming a fibrous structure by injection; controlling process parameters to adjust diameters of fibers of the fibrous structure and thickness of membranes of the fibrous structure; heating the fibrous structure to remove polymer and produce a nanoscale fibrous membrane; and disposing the nanoscale fibrous membrane on a heat dissipation substrate to produce an emissivity modulation layer.

In one of the exemplary embodiments, the method of preparing the thermal radiation heat dissipation comprises the steps of providing a polar dielectric material having sub-wavelength particles; uniformly grinding the polar dielectric material into powder and mixing same; putting the mixed powder in a mold; and heating the mold at a temperature less than a melting point of the polar dielectric material until a product having a self-supporting structure is produced.

In one of the exemplary embodiments, an arrangement using the thermal radiation heat dissipation device, comprises an electronic component; and a heat transfer pipe having one end connected to the electronic component and the other end connected to the heat dissipation substrate; heat generated by the electronic component is configured to transfer to the heat dissipation substrate through the heat transfer pipe in operation; and an amount of heat absorbed by the heat dissipation substrate is transferred to the emissivity modulation layer prior to transferring to the air by thermal radiation.

The above and other objects, features and advantages of the invention will become apparent from the following detailed description taken with the accompanying drawings.

BRIEF DESCRIPTION OF THE DRAWINGS

FIG. 8 is a table tabulating radiation power ($P_{rad}$) of boron nitride, silicon dioxide, and a mixture of boron nitride and silicon dioxide of mixing ratio of 1 to 1 and porosity of 0.3 at 300 K, 330 K and 373 K respectively;

FIG. 10 is a table tabulating radiation power ($P_{rad}$) of silicon nitride ($Si_3N_4$), calcium sulfate ($CaSO_4$), and a mixture of silicon nitride ($Si_3N_4$) and calcium sulfate ($CaSO_4$) of mixing ratio of 1 to 1 and porosity of 0.3 at 300 K, 330 K and 373 K respectively;

DETAILED DESCRIPTION OF THE INVENTION

Figure 1:
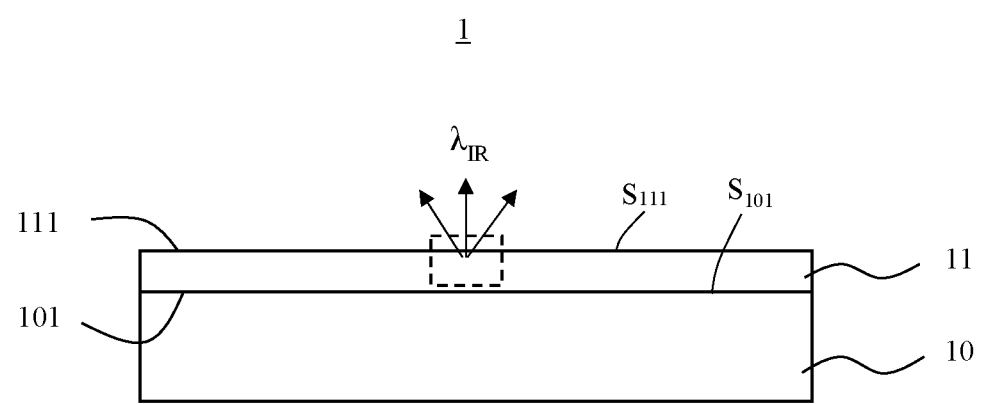
FIG. 1 is a schematic, cross-sectional view of a thermal radiation heat dissipation device for electronic component according to a first preferred embodiment of the invention.

Embodiments of the invention will now be described, by way of example only, with reference to the accompanying drawings.

The invention is related to electromagnetic radiation of different wavelengths in which solar radiation means its wavelength located at any electromagnetic radiation in solar radiation of wavelength range of spectrum; solar radiation in wavelength range of spectrum means wavelength of 0.3 μm to 4 μm; thermal radiation means its wavelength located at any electromagnetic radiation in black body radiation of wavelength range of spectrum, black body radiation in wavelength range of spectrum means wavelength of about 4 μm to 25 μm, and atmospheric transparent window's wavelength range means wavelength of about 8 μm to 13 μm. It is understood that above wavelengths are exemplary, not limited. Different radiation wavelengths aim to explain principles and advantages of technical characteristics of the invention and do not aim to limit the invention to the specific wavelengths.

In the invention, diffuse reflection of material or structure means percentage of any incident electromagnetic radiation reflectively diffused from a surface. A perfect reflective body is defined as a body having 100% diffuse reflection. In the invention, high diffuse reflection means a material or structure has at least 60% diffuse reflection in a specific range, preferably, more than 80% diffuse reflection, and more preferably, more than 95% diffuse reflection.

In the invention, emissivity of a material or structure means efficacy of emitting electromagnetic radiation. A perfect black body emitter is defined as one has 100% emissivity. In the invention, high emissivity means a material or structure has at least 70% emissivity in a specific range, preferably, more than 80% emissivity, and more preferably, more than 95% emissivity.

In the invention, transmittance of a material or structure means ratio of electromagnetic wave penetrating the material or structure in a specific wavelength range. A perfect material or structure is defined as one has 100% transmittance. In the invention, high transmittance means a material or structure has about 60% transmittance in a specific range, preferably, more than 80% transmittance, and more preferably, more than 95% transmittance.

In the invention, sub-wavelength structure of a material or structure means the material or structure includes measure of at least one direction less than wavelength of electromagnetic radiation being compared. For example, measure of at least one direction is equal to or less than particle of any shape of wavelength having the maximum strength of material black body radiation, or diameter less than a structure formed of fibers of any shape having the maximum strength of material black body radiation. Wavelength of a material black body radiation having the maximum strength can be obtained by calculating material temperature based on Wien's displacement law.

In the invention, radiation heat transfer pile means a material having a high energy gap and being low in absorption of thermal radiation wavelength range of spectrum. For example, but not limited to, the material is oxide such as $Al_2O_3$, $ZnO$, $MgO$, $TiO_2$, $SiO_2$, $HfO_2$, or $ZrO_2$; nitride such as AlN, hBN, cBN, $Si_3N_4$, or GaN; SiC; metallic chloride such as $CaF_2$, $MgF_2$, or $BaF_2$; carbonate such as $CaCO_3$ or $CaMg(CO_3)_2$ having $CO_3^{2-}$; sulfate such as $BaSO_4$ or $CaSO_4$ having $SO_4^{2-}$; or phosphate having $PO_4^{3-}$.

In the invention, optical phonons are out-of-phase movements of the atoms in the lattice, one atom moving to the left, and its neighbor to the right. This occurs if the lattice basis consists of two or more atoms. They are called optical because in ionic crystals, such as sodium chloride, fluctuations in displacement create an electrical polarization that couples to the electromagnetic field. Hence, they can be excited by infrared radiation, the electric field of the light will move every positive sodium ion in the direction of the field, and every negative chloride ion in the other direction, causing the crystal to vibrate. Acoustic phonons are coherent movements of atoms of the lattice out of their equilibrium positions. If the displacement is in the direction of propagation, then in some areas the atoms will be closer, in others farther apart, as in a sound wave in air (hence the name acoustic). Displacement perpendicular to the propagation direction is comparable to waves on a string. If the wavelength of acoustic phonons goes to infinity, this corresponds to a simple displacement of the whole crystal, and this costs zero deformation energy. Acoustic phonons exhibit a linear relationship between frequency and phonon wave-vector for long wavelengths. The frequencies of acoustic phonons tend to zero with longer wavelength. Optical phonons have a non-zero frequency at the Brillouin zone center and show no dispersion near that long wavelength limit. This is because they correspond to a mode of vibration where positive and negative ions at adjacent lattice sites swing against each other, creating a time-varying electrical dipole moment.

Referring to FIG. 1, a schematic, cross-sectional view of a thermal radiation heat dissipation device 1 for electronic components in accordance with a first preferred embodiment of the invention is shown and details thereof are discussed below. The thermal radiation heat dissipation device 1 includes a heat dissipation substrate 10 including a heat dissipation surface 101 having a heat dissipation surface emissivity $S_{101}$; and an emissivity modulation layer 11 provided on the heat dissipation surface 101 including an emissivity modulation layer surface 111 having an emissivity modulation layer surface emissivity $S_{111}$ in which the emissivity modulation layer surface emissivity $S_{111}$ is greater the heat dissipation surface emissivity $S_{101}$.

The heat dissipation substrate 10 is made of a material having high thermal conductivity, but not limited to, such as metal. The metal (e.g., aluminum or copper) is advantageous due to high thermal conductivity, lightweight, malleable and ductile. A heat sink made of the metal is widely used in CPU of computer, VGA, GPU, power chip, power supply, test equipment, uninterruptible power supply, power amplifier, signal amplifier, electronic components of an automatic control system, electric device, LED lamp, etc. While the metal has high thermal conductivity, its emissivity is very low and is not appropriate for heat dissipation. Thus, heat builds up in the heat sink and only a small amount of heat can be dissipated from the heat sink. Additional thermal conduction or convection arrangement is required. Regarding the emissivity modulation layer 11 of the invention is provided for modulating the emissivity of the heat dissipation surface 101 so that low emissivity of the heat dissipation substrate 10 can be modulated to high emissivity. As a result, more heat can be dissipated from a body by the thermal radiation heat dissipation device 1.

Material of the emissivity modulation layer 11 is polar dielectric material, polymer or composite polar dielectric material.

Figure 2:
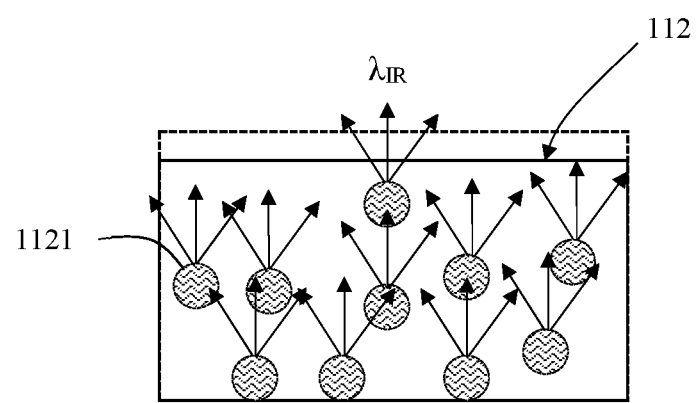
FIG. 2 is a greatly enlarged view of a rectangle in broken lines of FIG. 1 showing details of the emissivity modulation layer.

Referring to FIG. 2, it is a greatly enlarged view of a rectangle in broken lines of FIG. 1 showing details of the emissivity modulation layer 11. The emissivity modulation layer 11 of the invention includes a polar dielectric material assembly 112 including a plurality of optical phonons 1121 which are capable of interacting with thermal radiation $\lambda_{IR}$ to increase strength of the thermal radiation $\lambda_{IR}$. The optical phonon 1121 is generated when vibration of atoms in a lattice causes change of relative positions of the atoms. It is resonance when dipole between different atoms couples with electromagnetic wave of a specific frequency. It is useful to extract optical phonons within the resonant wavelength range. Optical phonons can increase emissivity of electromagnetic wave. In the embodiment, resonance is generated when the optical phonon 1121 interacts with the thermal radiation $\lambda_{IR}$ of a specific frequency. The optical phonon 1121 can increase strength of the thermal radiation $\lambda_{IR}$ of the specific frequency.

Figure 3:
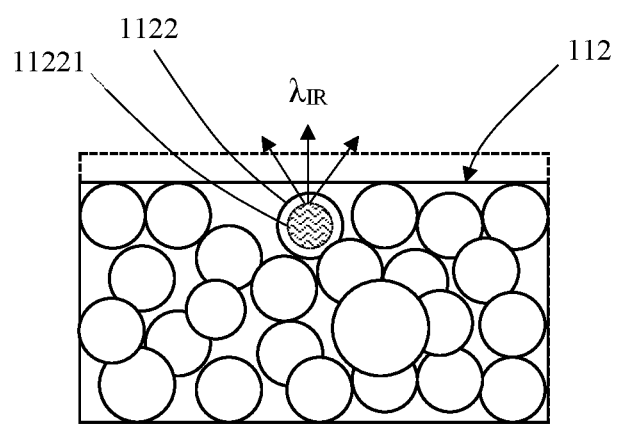
FIG. 3 is a greatly enlarged view of an emissivity modulation layer of a thermal radiation heat dissipation device for electronic component according to a second preferred embodiment of the invention.

Referring to FIG. 3, it is a greatly enlarged view of an emissivity modulation layer 11 of a thermal radiation heat dissipation device for electronic component according to a second preferred embodiment of the invention. The characteristics of the second preferred embodiment are substantially the same as that of the first preferred embodiment except the following: the polar dielectric material assembly 112 includes a plurality of polar dielectric material units 1122. The polar dielectric material assembly 112 is formed by tidily or untidily piling the polar dielectric material units 1122. It is understood that shape of the polar dielectric material unit 1122 is not limited to disc. Further, the polar dielectric material units 1122 are not required to have the same size. The polar dielectric material assembly 112 can be porous with other materials, but not limited to, polymer or materials having high emissivity filled into the pores.

Figure 4:
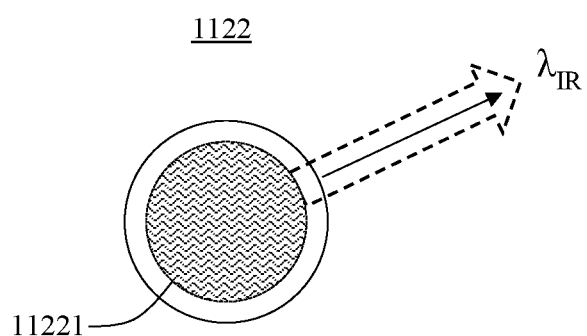
FIG. 4 schematically depicts the polar dielectric material unit including an optical phonon.

Referring to FIG. 4, it schematically depicts the polar dielectric material unit 1122 including an optical phonon 11221 of FIG. 3. The optical phonon 11221 interacts with thermal radiation $\lambda_{IR}$ so that strength of the thermal radiation $\lambda_{IR}$ can be increased.

The emissivity modulation layer 11 of the first embodiment is made of polymer such as natural polymer or synthetic polymer. Natural polymer is, but not limited to, protein (silk fibroin, sericin, elastin, collagen, keratin, etc.), polysaccharides (cellulose, hemicellulose, chitosan etc.). The synthetic polymer is, but not limited to, polyacrylic, polystyrene, polymethyl methacrylate, polyvinyl chloride, nylon, polycarbonate, polyurethane, teflon, polyethylene terephthalate, polyvinylidene fluoride, polyetherimide, polydimethylsiloxane, polyacrylamide, polyvinyl alcohol, polyethylene oxide, polyvinylpyrrolidone, etc.

Alternatively, the emissivity modulation layer 11 of the first the embodiment is made of polymer such as water-soluble polymer or oil soluble polymer. The water-soluble polymer is, but not limited to, protein (silk fibroin, sericin, elastin, collagen, keratin, etc.), polysaccharides (cellulose, hemicellulose, chitosan etc.), polyacrylamide, polyvinyl alcohol, polyethylene oxide, polyvinylpyrrolidone, etc. The oil soluble polymer is, but not limited to, polypropylene, polystyrene, polymethyl methacrylate, polyvinyl chloride, nylon, polycarbonate, polyurethane, teflon, polyethylene terephthalate, polyvinylidene fluoride, polyetherimide amine, dimethicone, etc.

Figure 5:
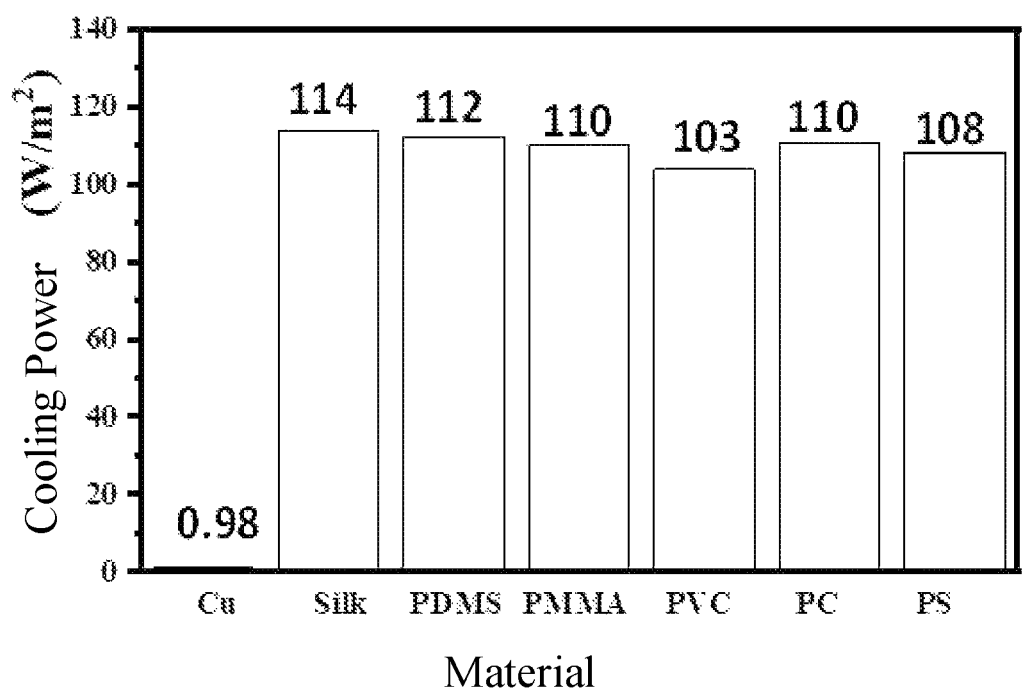
FIG. 5 is a bar chart of cooling power and material for different polymers in terms of the emissivity modulation layer.

Referring to FIG. 5, it is a bar chart of cooling power and material for different polymers in terms of the emissivity modulation layer 11. The heat dissipation substrate 10, made of copper, includes the emissivity modulation layer 11 provided thereon. The emissivity modulation layer 11 is made of polymer. In comparison with a heat dissipation substrate without an emissivity modulation layer in terms of cooling power, it can be found that while copper has high thermal conductivity, copper has a very low thermal radiation. Thus, it is impossible to cool a body by means of a heat sink made of copper. It is envisaged by the invention that with the provision of the emissivity modulation layer 11 having high emissivity, cooling power can be increased from 0.98(W/m$^2$) to 114(W/m$^2$). In short, the emissivity modulation layer 11 is capable of modulating emissivity of the heat dissipation substrate 10, thereby sufficiently dissipating heat from electronic components.

Figure 6:
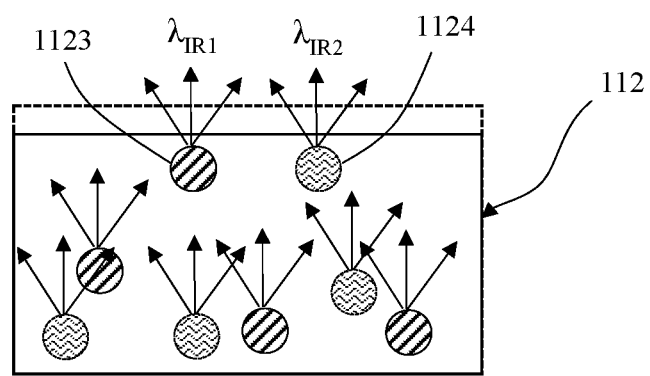
FIG. 6 is a greatly enlarged view of an emissivity modulation layer of a thermal radiation heat dissipation device for electronic component according to a third preferred embodiment of the invention.

Referring to FIG. 6, it is a greatly enlarged view of an emissivity modulation layer 11 of a thermal radiation heat dissipation device for electronic component according to a third preferred embodiment of the invention. The emissivity modulation layer 11 includes a polar dielectric material assembly 112 including a plurality of first optical phonons 1123 and a plurality of second optical phonons 1124. The first optical phonon 1123 interacts with a first thermal radiation $\lambda_{IR1}$, the second optical phonon 1124 interacts with a second thermal radiation $\lambda_{IR2}$, and a wavelength of the thermal radiation $\lambda_{IR1}$ is different from that of the second thermal radiation $\lambda_{IR2}$. Resonance is generated when the first optical phonon 1123 or the second optical phonon 1124 interacts with electromagnetic waves of different frequencies. In detail, the first optical phonon 1123 interacts with the first thermal radiation $\lambda_{IR1}$ to generate resonance and the second optical phonon 1124 interacts with the second thermal radiation $\lambda_{IR2}$ to generated resonance. The first optical phonon 1123 can increase strength of the first thermal radiation $\lambda_{IR1}$ of a first frequency and the second optical phonon 1124 can increase strength of the second thermal radiation $\lambda_{IR2}$ of a second frequency different from the first frequency.

In the embodiment, the emissivity modulation layer 11 includes the plurality of first optical phonons 1123 and the plurality of second optical phonons 1124. Advantages of the first or second optical phonons include being capable of selecting a polar dielectric material having a specific resonant wavelength range, contributing to the control of spectrum, and producing a heat dissipation device having a wide wavelength range by incorporating a plurality of polar dielectric materials having different optical phonon resonant wavelength ranges.

Figure 7:
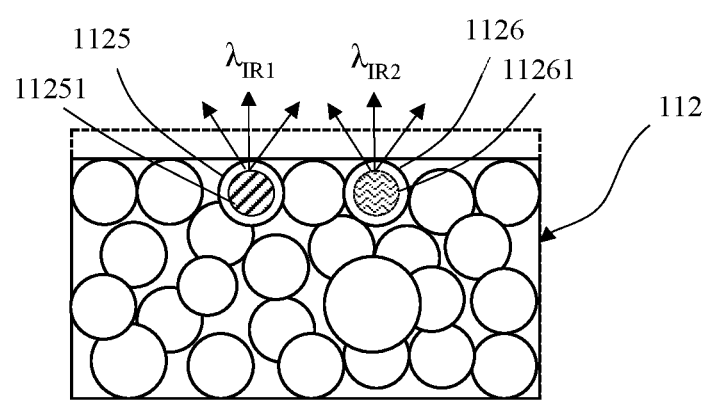
FIG. 7 is a greatly enlarged view of an emissivity modulation layer of a thermal radiation heat dissipation device for electronic component according to a fourth preferred embodiment of the invention.

Referring to FIG. 7, it is a greatly enlarged view of an emissivity modulation layer 11 of a thermal radiation heat dissipation device for electronic component according to a fourth preferred embodiment of the invention. In the embodiment, the emissivity modulation layer 11 includes a polar dielectric material assembly 112 including a plurality of first polar dielectric material units 1125 and a plurality of second polar dielectric material units 1126. In the embodiment, the polar dielectric material assembly 112 is formed by tidily or untidily piling the first polar dielectric material units 1125 and the second polar dielectric material units 1126. It is understood that shape of the polar dielectric material unit 1125 or the second polar dielectric material unit 1126 is not limited to disc. Further, the first polar dielectric material units 1122 or the second polar dielectric material units 1126 are not required to have the same size. The first polar dielectric material unit 1125 includes a plurality of first optical phonons 11251 and the second polar dielectric material unit 1126 includes a plurality of second optical phonons 11261. Resonance is generated when the first optical phonon 11251 or the second optical phonon 11261 interacts with electromagnetic waves of different frequencies. In detail, the first optical phonon 11251 interacts with the first thermal radiation $\lambda_{IR1}$ to generate resonance and the second optical phonon 11261 interacts with the second thermal radiation $\lambda_{IR2}$ to generated resonance. The first optical phonon 11251 can increase strength of the first thermal radiation $\lambda_{IR1}$ of a first frequency and the second optical phonon 11261 can increase strength of the second thermal radiation $\lambda_{IR2}$ of a second frequency different from the first frequency.

In the embodiment, the emissivity modulation layer 11 includes the plurality of first optical phonons 1125 and the plurality of second optical phonons 1126. Advantages of the first or second optical phonons include being capable of selecting a polar dielectric material having a specific resonant wavelength range, contributing to the control of spectrum, and producing a heat dissipation device having a wide wavelength range by incorporating a plurality of polar dielectric materials having different optical phonon resonant wavelength ranges.

In the embodiment, the emissivity modulation layer 11 is discussed as a polar dielectric material assembly. It is understood that a different polar dielectric material assembly or polymer can be used in other embodiments without departing from the spirit and scope of the invention. In the embodiment, the first polar dielectric material unit 1125 and the second polar dielectric material unit 1126 are, but not limited to, the following chemical compounds. The first polar dielectric material unit 1125 is boron nitride, and the second polar dielectric material unit 1126 is silicon dioxide.

Referring to FIG. 8, it is a table tabulating radiation powers ($P_{rad}$) of boron nitride (h-BN), silicon dioxide (SiO$_2$), and a mixture of boron nitride (h-BN) and silicon dioxide (SiO$_2$) of mixing ratio of 0.5 to 0.5 and porosity of 0.3 at 300 K, 330 K and 373 K respectively; and the mixture of boron nitride and silicon dioxide being used for manufacturing the thermal radiation heat dissipation device having a wide wavelength range of the invention.

Figure 9:
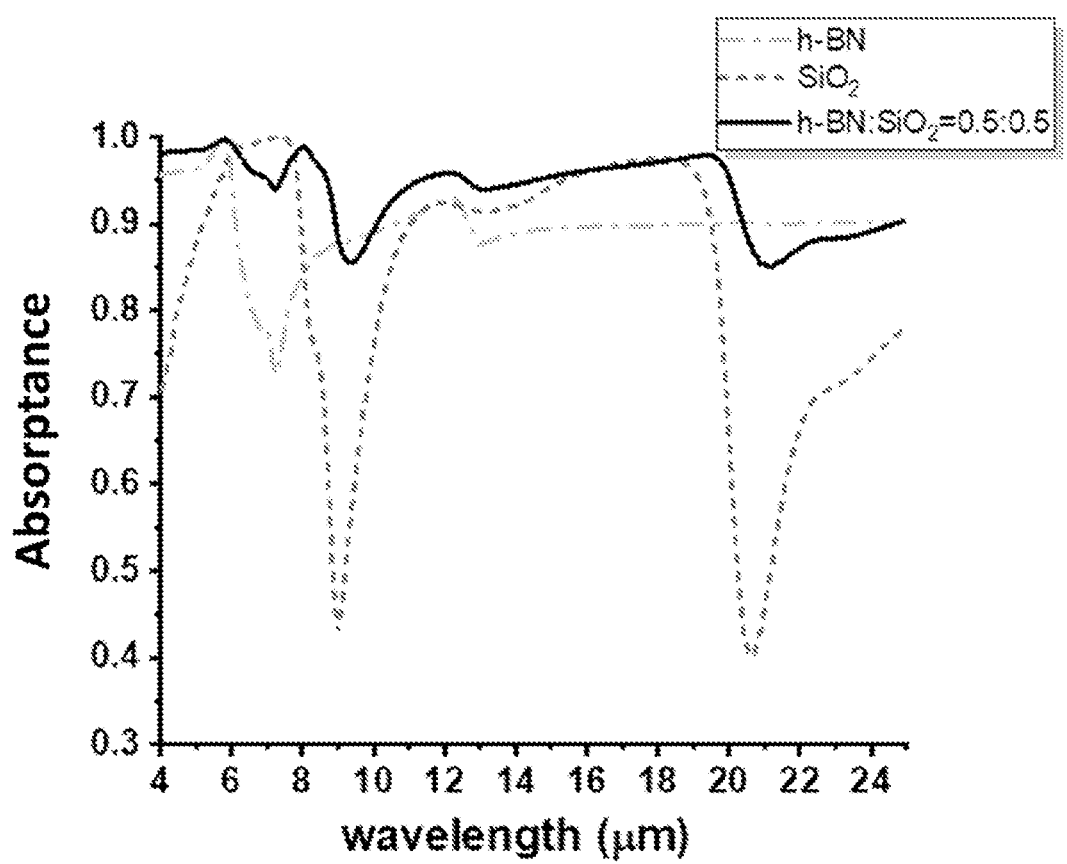
FIG. 9 is a chart showing absorptance versus wavelength of 4-25 μm for boron nitride (h-BN), silicon dioxide ($SiO_2$), and the mixture of boron nitride (h-BN) and silicon dioxide ($SiO_2$) respectively.

Referring to FIG. 9, it is a chart showing absorptance versus wavelength of 4-25 μm for boron nitride (h-BN), silicon dioxide ($SiO_2$), and a mixture of boron nitride (h-BN) and silicon dioxide ($SiO_2$) respectively in which the mixture of boron nitride (h-BN) and silicon dioxide ($SiO_2$) has a mixing ratio of 0.5 to 0.5 and a porosity of 0.3, and the wavelengths are between 4 μm and 25 μm. Regarding boron nitride (h-BN), a first valley of absorptance occurs at a wavelength range between 6 μm and 8 μm; and a second valley of absorptance occurs at a wavelength range between 12 μm and 13 μm. Regarding silicon dioxide ($SiO_2$), a first valley of absorptance occurs at a wavelength range between 8 μm and 10 μm; a second valley of absorptance occurs at a wavelength range between 20 μm and 21 μm. Regarding the mixture of boron nitride (h-BN) and silicon dioxide ($SiO_2$) and taking the self-supporting having the porosity of 0.3 into consideration, and a calculation is made based on equivalent interface theory. It is found that the mixture of boron nitride (h-BN) and silicon dioxide ($SiO_2$) can substantially eliminate the occurred valleys of absorptance of each of the first polar dielectric material unit 1125 and the second polar dielectric material unit 1126. As a result, absorptance of the surface of each of the above materials is greatly increased. It is possible to make a calculation of radiation power of a material at a high temperature based on the heat dissipation device of the invention and the material's absorption spectrum. The radiation power of boron nitride (h-BN) at 373 K is 860.14 $W/m^2$, the radiation power of silicon dioxide ($SiO_2$) at 373 K is 830.59 $W/m^2$, and radiation power of the radiation power of the mixture of boron nitride (h-BN) and silicon dioxide ($SiO_2$) at 373 K is greatly increased to 917.93 $W/m^2$. As described above, the mixture of boron nitride (h-BN) and silicon dioxide ($SiO_2$) being used for manufacturing the thermal radiation heat dissipation device having a wide wavelength range of the invention.

Alternatively, in the embodiment, the first polar dielectric material unit 1125 and the second polar dielectric material unit 1126 are, but not limited to, the following chemical compounds. The first polar dielectric material unit 1125 is silicon nitride, and the second polar dielectric material unit 1126 is calcium sulfate.

Referring to FIG. 10, it is a table tabulating radiation powers ($P_{rad}$) of silicon nitride ($Si_3N_4$), calcium sulfate ($CaSO_4$), and a mixture of silicon nitride ($Si_3N_4$) and calcium sulfate ($CaSO_4$) of mixing ratio of 0.5 to 0.5 and porosity of 0.3 at 300 K, 330 K and 373 K respectively; and the mixture of silicon nitride ($Si_3N_4$) and calcium sulfate ($CaSO_4$) being used for manufacturing the thermal radiation heat dissipation device having a wide wavelength range of the invention.

Figure 11:
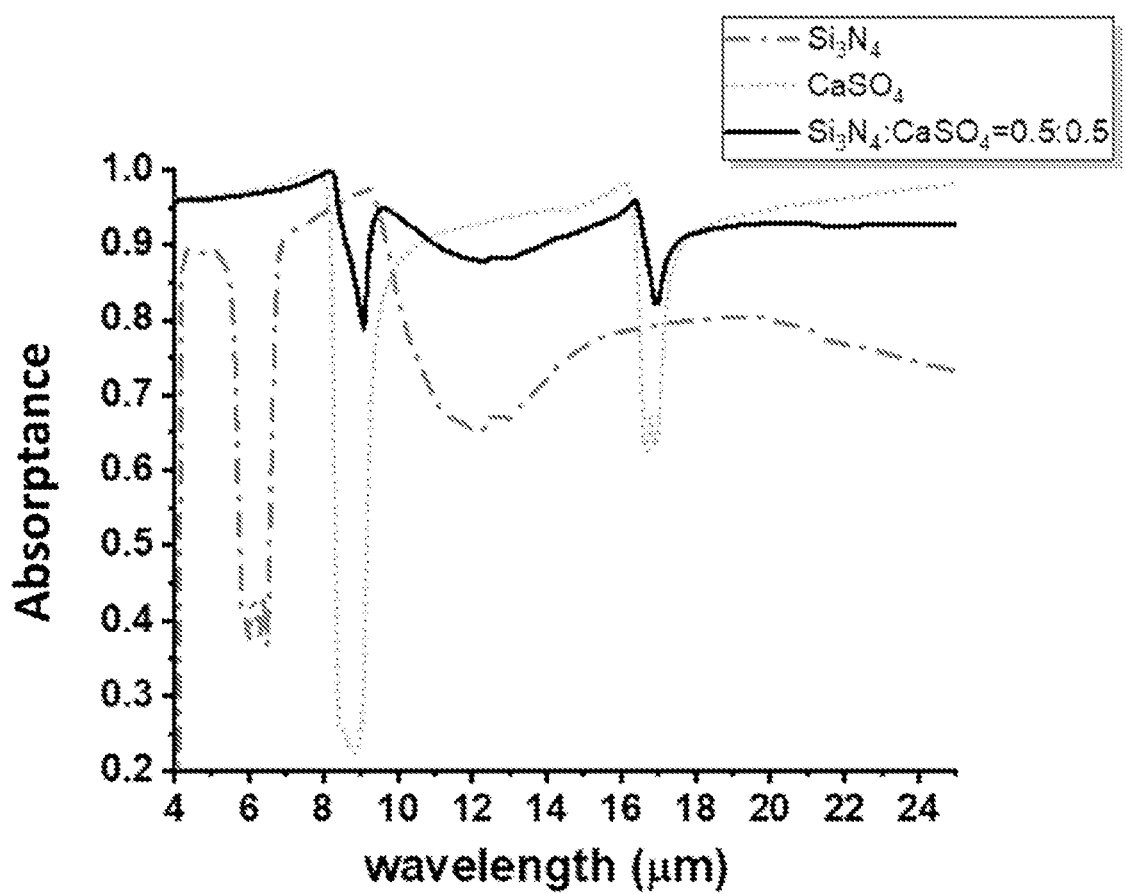
FIG. 11 is a chart showing absorptance versus wavelength of 4-25 μm for silicon nitride ($Si_3N_4$), calcium sulfate ($CaSO_4$), and a mixture of silicon nitride ($Si_3N_4$) and calcium sulfate ($CaSO_4$) respectively.

Referring to FIG. 11, it is a chart showing absorptance versus wavelength of 4-25 μm for silicon nitride ($Si_3N_4$), calcium sulfate ($CaSO_4$), and a mixture of silicon nitride ($Si_3N_4$) and calcium sulfate ($CaSO_4$) respectively in which the mixture of silicon nitride ($Si_3N_4$) and calcium sulfate ($CaSO_4$) has a mixing ratio of 0.5 to 0.5 and a porosity of 0.3, and the wavelengths are between 4 μm and 25 μm. Regarding silicon nitride ($Si_3N_4$), a first valley of absorptance occurs at a wavelength range between 6 μm and 7 μm; and a second valley of absorptance occurs at a wavelength range between 10 μm and 14 μm. Regarding calcium sulfate ($CaSO_4$), a first valley of absorptance occurs at a wavelength range between 8 μm and 9 μm; a second valley of absorptance occurs at a wavelength range between 16 μm and 18 μm. Regarding the mixture of silicon nitride ($Si_3N_4$) and calcium sulfate ($CaSO_4$) and taking the self-supporting having the porosity of 0.3 into consideration, and a calculation is made based on equivalent interface theory. It is found that the mixture of silicon nitride ($Si_3N_4$) and calcium sulfate ($CaSO_4$) can substantially eliminate the occurred valleys of absorptance of each of the first polar dielectric material unit 1125 and the second polar dielectric material unit 1126. As a result, absorptance of the surface of each of the above materials is greatly increased. It is possible to make a calculation of radiation power of a material at a high temperature based on the heat dissipation device of the invention and the material's absorption spectrum. The radiation power of silicon nitride ($Si_3N_4$) at 373 K is 758.00 $W/m^2$, the radiation power of calcium sulfate ($CaSO_4$) at 373 K is 852.22 $W/m^2$, and radiation power of the radiation power of the mixture of silicon nitride ($Si_3N_4$) and calcium sulfate ($CaSO_4$) at 373 K is greatly increased to 902.36 $W/m^2$. As described above, the mixture of silicon nitride ($Si_3N_4$) and calcium sulfate ($CaSO_4$) being used for manufacturing the thermal radiation heat dissipation device having a wide wavelength range of the invention.

It is understood that material of the emissivity modulation layer 11 is polar dielectric material, polymer or composite polar dielectric material. Different materials have different black body radiation wavelength ranges of spectrum. It is possible to mix materials of different emissivity modulation layers 11 based on different applications and different heat dissipation substrates 10 so that emissivity of each heat dissipation substrate 10 can be modulated.

In the embodiment, the polar dielectric material assembly including a plurality of polar dielectric material units shaped as a pile having a self-supporting structure. A process of preparing the thermal radiation heat dissipation device of the invention is performed at a temperature less than a melting point of the polar dielectric material units. Thus, support for the polar dielectric material assembly is not required. The thermal radiation heat dissipation device of the invention can be provided on an object for dissipating heat from the object. The heat dissipation performance is excellent. The process of preparing the thermal radiation heat dissipation device of the invention comprises, but not limited to the steps of providing a polar dielectric material having one or more sub-wavelength structural particles; grinding the polar dielectric material into powder and mixing same; molding by selectively pressing the powder; removing a half-finished product from the mold; and heating the half-finish product at high temperature for a predetermined period of time until a product is produced. In an exemplary example, the process comprises, but not limited to the steps of providing zinc oxide particles having an average diameter of 559 nm, providing silicon dioxide particles having an average diameter of 542 nm, and aluminum oxide particles having an average diameter of 776 nm; grinding the polar dielectric material into powder and mixing same in a bowl; molding the mixture in a mold having a diameter of 2.54 cm by pressing the mixed powder with a pressure of 80 $kg/cm^3$ for two minutes; removing a half-finished product from the mold; and heating the half-finish product at 700-800° C. for 1-2 hours until a product is produced. The product has a thickness of hundreds micrometers to several millimeters. Preferably, the product has a thickness of 100 μm to 1000 μm. The polar dielectric material of the invention has a high melting point. The material thus can withstand high temperature for a long time. Further, a high radiation power is provided by the invention. It is understood that above measurements are for illustration only. The invention is not limited to the above measurements.

In the invention, size of the polar dielectric material unit is a sub-wavelength structure which is defined as a fiber of any shape having a diameter equal to or less than the wavelength of electromagnetic radiation. For example, the polar dielectric material unit is a nanometric fibrous membrane made of silicon dioxide. Diameter of the polar dielectric material unit of the invention is nanoscale. Alternatively, the polar dielectric material unit is implemented as a fibrous structure having a plurality of nanoparticles.

A process of manufacturing the fibrous structure involves electrospinning. In detail, the process comprises, but not limited to, the steps of providing both a silicon oxide precursor solution; mixing tetraethyl orthosilicate and $H_3PO_4$ with deionized water and agitating same in room temperature to form a first solution; providing a polyvinyl alcohol (PVA) solution as polymer for electrospinning; adding PVA to the first solution and heating and agitating same until a uniformly solved second solution is formed; uniformly mixing the silicon oxide precursor solution and the second solution to form a composite solution; filling the composite solution in an injector and securing the injector to a syringe pump; subjecting the injector to an electrospinning machine, repulsion force between charges neutralizing surface tension of liquid so that the liquid drop becomes longer to shape as a conic drop; after voltage has increased to a value greater than a threshold, the repulsion force between charges being greater than surface tension of liquid to generate a flow injecting from the injector to a collector with the liquid being vaporized during the injection; collecting a formed fibrous structure on the collector; controlling process parameters including compositions and concentration of the solution, flow rate and applied voltage to control diameters of fibers of the fibrous structure; controlling injection rate and time to control thickness of membranes of the fibrous structure; heating the fibrous structure to remove the polymer to form a nanoscale radiation heat transfer pile fiber; and decreasing temperature to room temperature to remove polymer and produce a nanoscale fibrous membrane made of silicon dioxide. It is understood that above steps are for purposes of explanation only not for limiting the scope of the invention.

Thermal resistance of the polar dielectric material of the invention is expressed in watts per square meter kelvin ($m^2*K/W$) in SI unit, i.e., thermal insulance of a material. Thermal insulance means a temperature difference between two ends of an object with heat passing through the object per square meter kelvin. It can be calculated by dividing thickness of a material by thermal conductivity (W/m*K) of the material. Thermal insulance of typical insulating materials is greater than 0.1 $m^2*K/W$ and thermal insulance of typical metal materials is between $1*10^{-4}$ and $1*10^{-5}$ $m^2*K/W$. In the invention, the polar dielectric material assembly includes the plurality of polar dielectric material units shaped as a pile having a self-supporting structure. Thermal conductivity of the polar dielectric material of the invention is between 0.5 and 10.0 W/m*K ad thermal insulance thereof is less than $5*10^{-3}$ $m^2*K/W$.

The thermal radiation heat dissipation device 1 of the invention includes the heat dissipation substrate 10 including the heat dissipation surface 101; and the emissivity modulation layer 11 provided on the heat dissipation surface 101 including emissivity modulation layer emissivity modulation layer surface 111. Material of the emissivity modulation layer 11 is polar dielectric material, polymer or composite polar dielectric material. Advantages of the invention include being capable of selecting a polar dielectric material having a specific resonant wavelength range, contributing to the control of spectrum, and producing a thermal radiation heat dissipation device having a wide wavelength range by incorporating a plurality of polar dielectric materials so as to fulfill the heat dissipation needs of different applications. Composite material is a material which is produced from two or more constituent materials. These constituent materials have notably dissimilar chemical or physical properties and are merged to create a material with properties unlike the individual elements. Within the finished structure, the individual elements remain separate and distinct, distinguishing composites from mixtures and solid solutions. The composite material may have one or more layers. It is understood that the invention aims to provide a thermal radiation heat dissipation device including a heat dissipation substrate having an emissivity modulation layer so that emissivity at wavelength ranges of spectrum can be controlled in order to meet needs of different cooling application. This is within the scope and spirit of the invention.

Figure 12:
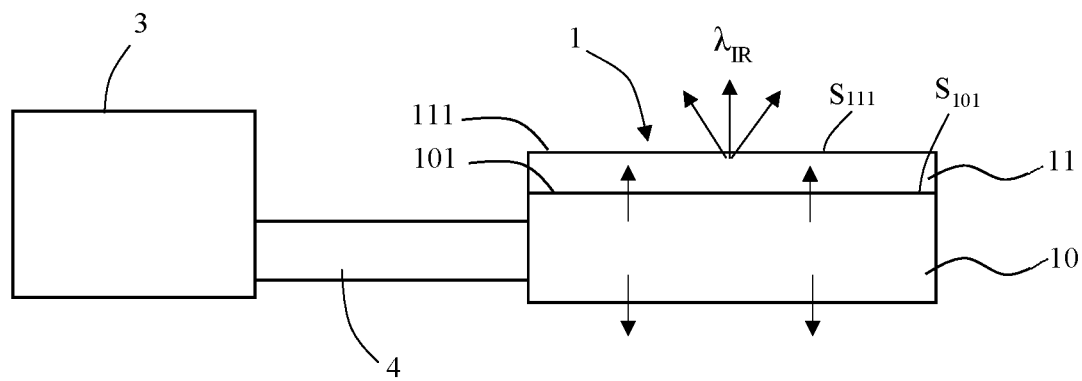
FIG. 12 schematically depicts the thermal radiation heat dissipation device connected to a heat transfer pipe which is in turn connected to an electronic component.

Referring to FIG. 12, it schematically depicts the thermal radiation heat dissipation device 1 connected to a heat transfer pipe 4 which is in turn connected to an electronic component 3. Heat generated by the electronic component 3 is transferred to the heat dissipation substrate 10 through the heat transfer pipe 4 in operations. Both the heat transfer pipe 4 and the heat dissipation substrate 10 are made of metal such as aluminum or copper each having high thermal conductivity so that the electronic component 3 can be sufficiently cooled by the thermal radiation heat dissipation device 1. An amount of heat absorbed by the thermal radiation heat dissipation device 1 is dissipated to the air by the heat dissipation substrate 10 by thermal conduction and thermal convection. Remaining amount of heat absorbed by the thermal radiation heat dissipation device 1 is transferred to the emissivity modulation layer 11 which in turn dissipates heat to the air by thermal radiation. Specifically, heat absorbed by the emissivity modulation layer 11 is dissipated to the air by thermal radiation $\lambda_{IR}$. Strength of the thermal radiation $\lambda_{IR}$ having a specific frequency is greatly increased. It is envisaged by the invention that the thermal radiation heat dissipation device 1 can effectively absorb heat and fulfill the purpose of heat dissipation.

Figure 13:
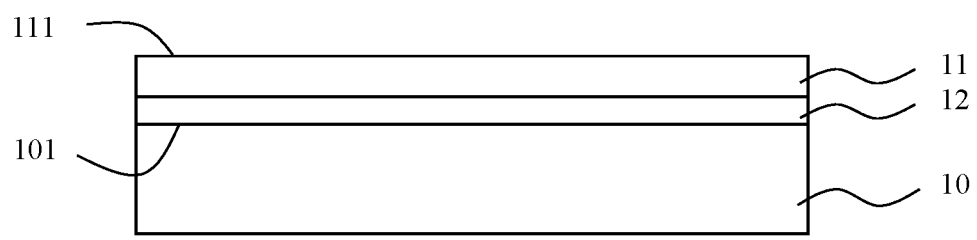
FIG. 13 is a schematic, cross-sectional view of a thermal radiation heat dissipation device for electronic component according to the second preferred embodiment of the invention.

Referring to FIG. 13, it is a schematic, cross-sectional view of a thermal radiation heat dissipation device 2 for electronic components according to the second preferred embodiment of the invention. The characteristics of the thermal radiation heat dissipation device 2 of the second preferred embodiment are substantially the same as that of the first preferred embodiment except the following: there is further provided a joining layer 12 provided between the heat dissipation substrate 10 and the emissivity modulation layer 11. The joining layer 12 is used to fill a gap between the heat dissipation substrate 10 and the emissivity modulation layer 11 so that thermal resistance between the heat dissipation substrate 10 and the emissivity modulation layer 11 can be decreased, resulting in an increase of heat transfer efficiency. The joining layer 12 has a high conduction coefficient. It is possible to adjust viscosity, flowability and expandability of the joining layer 12. The joining layer 12 includes, but not limited to resin, silicone paste, silicone resin, heat transfer mud, silicone pad, heat transfer silicone cloth, heat transfer oil, heat transfer coating, plastics, heat transfer membrane, isolation membrane, isolator, interface material, double sided adhesive, heat transfer substrate, phase-changing material, heat transfer film, mica, pad, adhesive tape, and conduction metal pad.

While the invention has been described in terms of preferred embodiments, those skilled in the art will recognize that the invention can be practiced with modifications within the spirit and scope of the appended claims.

What is claimed is:

1. A thermal radiation heat dissipation device, comprising:
a heat dissipation substrate including a heat dissipation surface having a heat dissipation surface emissivity; and an emissivity modulation layer disposed on the heat dissipation surface including an emissivity modulation layer surface having an emissivity modulation layer surface emissivity wherein the emissivity modulation layer surface emissivity is greater the heat dissipation surface emissivity;
wherein the heat dissipation substrate is formed of metal to absorb heat generated by an electronic component, and the emissivity modulation layer is polymer;
wherein the emissivity modulation layer includes a polarized material assembly and a polymer assembly; wherein the polarized material assembly has first resonant frequency and the polymer assembly has a second resonant frequency different from the first resonant frequency; wherein the polarized material assembly is configured to interact with a first thermal radiation and the polymer assembly is configured to interact with a second thermal radiation respectively; and wherein the polarized material assembly is configured to increase strength of the first thermal radiation and the polymer assembly is configured to increase strength of the second thermal radiation.

2. The thermal radiation heat dissipation device as claimed in claim 1, wherein the polarized material assembly includes a plurality of optical phonons which are capable of interacting with thermal radiation to increase strength of the thermal radiation.

3. The thermal radiation heat dissipation device as claimed in claim 2, wherein the polarized material assembly includes a plurality of polarized material units having an optical phonon configured to interact with thermal radiation.

4. The thermal radiation heat dissipation device as claimed in claim 1, wherein the polymer is natural.

5. The thermal radiation heat dissipation device as claimed in claim 4, wherein the natural polymer is selected from the group consisting of silk fibroin, sericin, elastin, collagen, keratin, cellulose, hemicellulose, and chitosan.

6. The thermal radiation heat dissipation device as claimed in claim 1, wherein the polymer is composite.

7. The thermal radiation heat dissipation device as claimed in claim 6, wherein the composite polymer is selected from the group consisting of polyacrylic, polystyrene, polymethyl methacrylate, polyvinyl chloride, nylon, polycarbonate, polyurethane, teflon, polyethylene terephthalate, polyvinylidene fluoride, polyetherimide, polydimethylsiloxane, polyacrylamide, polyvinyl alcohol, polyethylene oxide, and polyvinylpyrrolidone.

8. An arrangement using the thermal radiation heat dissipation device as claimed in claim 1, comprising:
the electronic component; and
a heat transfer pipe having one end connected to the electronic component and the other end connected to the heat dissipation substrate;
wherein the heat generated by the electronic component is configured to transfer to the heat dissipation substrate through the heat transfer pipe in operation; and an amount of heat absorbed by the heat dissipation substrate is transferred to the emissivity modulation layer prior to transferring to the air by thermal radiation.

9. A thermal radiation heat dissipation device, comprising:
a heat dissipation substrate including a heat dissipation surface having a heat dissipation surface emissivity; and an emissivity modulation layer disposed on the heat dissipation surface including an emissivity modulation layer surface having an emissivity modulation layer surface emissivity wherein the emissivity modulation layer surface emissivity is greater the heat dissipation surface emissivity;
wherein the emissivity modulation layer includes a polarized material assembly including a plurality of first optical phonons and a plurality of second optical phonons; wherein the first optical phonons have a first resonant frequency and the second optical phonons having a second resonant frequency different from the first resonant frequency; wherein the polarized material assembly is configured to interact with a first thermal radiation and a second thermal radiation respectively; wherein the first optical phonon is configured to interact with the first thermal radiation and the second optical phonon is configured to interact with the second thermal radiation respectively; and wherein the first optical phonon is configured to increase strength of the first thermal radiation and the second optical phonon is configured to increase strength of the second thermal radiation respectively.

10. A thermal radiation heat dissipation device, comprising:
a heat dissipation substrate including a heat dissipation surface having a heat dissipation surface emissivity; and an emissivity modulation layer disposed on the heat dissipation surface including an emissivity modulation layer surface having an emissivity modulation layer surface emissivity wherein the emissivity modulation layer surface emissivity is greater the heat dissipation surface emissivity;
wherein the emissivity modulation layer includes a plurality of first and second polarized material assemblies; wherein the first polarized material assembly includes a plurality of first optical phonons and the second polarized material assembly includes a plurality of second optical phonons respectively; wherein the first optical phonons have a first resonant frequency and the second optical phonons having a second resonant frequency different from the first resonant frequency; wherein the first polarized material assembly is configured to interact with a first thermal radiation and the second polarized material assembly is configured to interact with a second thermal radiation respectively; wherein the first optical phonon is configured to interact with the first thermal radiation and the second optical phonon is configured to interact with the second thermal radiation respectively; and wherein the first optical phonon is configured to increase strength of the first thermal radiation and the second optical phonon is configured to increase strength of the second thermal radiation respectively.

* * * * *